United States Patent
Wu et al.

(10) Patent No.: US 7,566,918 B2
(45) Date of Patent: Jul. 28, 2009

(54) NITRIDE BASED TRANSISTORS FOR MILLIMETER WAVE OPERATION

(75) Inventors: Yifeng Wu, Goleta, CA (US); Primit Parikh, Chapel Hill, NC (US); Marcia Moore, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 445 days.

(21) Appl. No.: 11/360,876

(22) Filed: Feb. 23, 2006

(65) Prior Publication Data

US 2007/0194354 A1 Aug. 23, 2007

(51) Int. Cl.
H01L 31/0328 (2006.01)
H01L 31/0336 (2006.01)
H01L 31/072 (2006.01)
H01L 31/109 (2006.01)

(52) U.S. Cl. .................. 257/194; 257/488; 257/E29.14

(58) Field of Classification Search .................. 257/20, 257/24, 192, 194, 488, E29.14
See application file for complete search history.

(56) References Cited

U.S. PATENT DOCUMENTS

| | | | |
|---|---|---|---|
| 4,946,547 | A | 8/1990 | Palmour et al. |
| 5,192,987 | A | 3/1993 | Khan et al. |
| 5,200,022 | A | 4/1993 | Kong et al. |
| 5,210,051 | A | 5/1993 | Carter, Jr. |
| 5,296,395 | A | 3/1994 | Khan et al. |
| RE34,861 | E | 2/1995 | Davis et al. |
| 5,393,993 | A | 2/1995 | Edmond et al. |
| 5,523,589 | A | 6/1996 | Edmond et al. |
| 5,592,501 | A | 1/1997 | Edmond et al. |
| 6,218,680 | B1 | 4/2001 | Carter, Jr. et al. |
| 6,316,793 | B1 | 11/2001 | Sheppard et al. |
| 2002/0066908 | A1 | 6/2002 | Smith |
| 2002/0167023 | A1 | 11/2002 | Chavarkar et al. |
| 2003/0102482 | A1 | 6/2003 | Saxler |
| 2004/0012015 | A1 | 1/2004 | Saxler |

FOREIGN PATENT DOCUMENTS

WO   WO 2005/024909   3/2005

OTHER PUBLICATIONS

Wu et al, "8-Watt GaN HEMTs at Millimeter-Wave Frequencies", Dec. 5, 2005, IEEE, pp. 583-585.*
U.S. Appl. No. 10/930,160, filed Aug. 31, 2004, Parikh.
U.S. Appl. No. 10/772,882, filed Feb. 5, 2004, Saxler.
U.S. Appl. No. 10/849,589, filed May 20, 2004, Saxler.
U.S. Appl. No. 10/849,617, filed May 20, 2004, Saxler.
U.S. Appl. No. 10/897,726, filed Jul. 23, 2004, Sheppard.
U.S. Appl. No. 10/976,422, filed Oct. 29, 2004, Wu.
U.S. Appl. No. 10/996,249, filed Nov. 23, 2004, Saxler.

(Continued)

Primary Examiner—Thien F Tran
(74) Attorney, Agent, or Firm—Myers Bigel Sibley & Sajovec

(57) ABSTRACT

Field effect transistors having a power density of greater than 5 W/mm when operated at a frequency of at least 30 GHz are provided. The power density of at least 5 W/mm may be provided at a drain voltage of 28 V. Transistors with a power density of at least 8 W/mm when operated at 40 GHz at a drain voltage of 28 V are also provided.

12 Claims, 2 Drawing Sheets

OTHER PUBLICATIONS

U.S. Appl. No. 10/856,098, filed May 28, 2004, Mishra.
U.S. Appl. No. 11/005,107, filed Dec. 6, 2004, Parikh.
U.S. Appl. No. 11/078,265, filed Mar. 11, 2005.
Ando et al. *IEEE Electron Device Letters* 24: 289-291 (2003).
Chini et al. *IEEE Electron Device Letters* 25(5): 229-231 (2004).
Karmalkar et al. *IEEE Transaction on Electron Devices* 48:1515-1521 (2001).
Khan et al. *Applied Physics Letters* 63: 1214 (1993).
Lyons et al. *IEEE MTT-S/IMS Proceedings* pp. 1673-1676 (Jun. 6-7, 2004).
Palacios et al. High-Power AlGaN/GaN HEMTs for Ka-Band Applications *IEEE Electron Device Letters* 26(11): 781-783 (2005).
Saito et al. "600V AlGaN/GaN Power-HEMT: Design, Fabrication and Demonstration on High Voltage DC-DC Converter" *Electron Devices Meeting, 2003. IEDM '03 Technical Digest. IEEE International*, pp. 23.7.1-23.7.4 (2003).
Saunier "GaN Technology Overview: Accomplisments and Challenges" *12th GAAS Symposium—Amsterdam*, 2004 pp. 543-546 (2004).
Thompson et al. "Performance of the AlGaN HEMT Structure with a Gate Extension" *IEEE Transactions on Electron Devices* 51(2): 292-295 (2004).
Tilak et al. *IEEE Electron Device Letters* 22: 504-506 (2001).
Wu et al. "30-W/mm GaN HEMTs by Field Plate Optimization" *IEEE Electron Device Letters* 25(3): 117-119 (2004).
Wu et al. *IEDM Tech Digest* Dec. 2-5, 2001, pp. 378-380 (2001).
Wu et al. *IEEE Electron Device Letters* 17: 455-457 (1996).
Zhang et al. *IEEE Electron Device Letters* 21: 421-423 (2000).
Wu et al, "8-Watt GaN HEMTs at Millimeter-Wave Frequencies," IEEE, 2005, 3 pages.
Sun et al, "Large-Signal Performance of Deep Submircometer AlGaN/AlN/GaN HEMTs with a Field-Modulating Plate", IEEE, 2004, pp. 1689-1692.
European Search Report for corresponding EP application No. 06124388.7 dated Jul. 7, 2007.

\* cited by examiner

NITRIDE BASED TRANSISTORS FOR MILLIMETER WAVE OPERATION

STATEMENT OF GOVERNMENT INTEREST

This invention was made with Government support under Contract No. N00014-03-C-0092 awarded by The Office of Naval Research. The Government has certain rights in the invention.

FIELD OF THE INVENTION

The present invention relates to semiconductor devices and, more particularly, to wide bandgap transistors configured for millimeter wave operation.

BACKGROUND

Materials such as silicon (Si) and gallium arsenide (GaAs) have found wide application in semiconductor devices. These more familiar semiconductor materials may not be well suited for higher power and/or high frequency applications, however, because of their relatively small bandgaps (e.g., 1.12 eV for Si and 1.42 for GaAs at room temperature) and/or relatively small breakdown voltages.

Accordingly, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials typically have higher electric field breakdown strengths and higher electron saturation velocities as compared to gallium arsenide and silicon.

A device of particular interest for high power and/or high frequency applications is the High Electron Mobility Transistor (HEMT), which, in certain cases, is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of, for example, 1013 carriers/cm2. Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity. A major portion of the electrons in the 2DEG is attributed to polarization in the AlGaN.

HEMTs in the GaN/AlGaN system have already been demonstrated. U.S. Pat. Nos. 5,192,987 and 5,296,395 describe AlGaN/GaN HEMT structures and methods of manufacture. U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

Wide bandgap GaN-based high-electron-mobility-transistors (HEMTs) have come a long way as microwave devices since their description in 1993 in Khan et al., Appl. Phys. Lett., vol. 63, p. 1214, 1993, and a demonstration of their power capability in 1996 in Wu et al., IEEE Electron Device Lett., vol. 17, pp. 455-457, September 1996. Many research groups have presented devices with power densities exceeding 10 W/mm, a ten-fold improvement over conventional III-V devices. See Tilak et al., IEEE Electron Device Lett., vol. 22, pp. 504-506, November 2001; Wu et al., IEDM Tech Dig., Dec. 2-5, 2001, pp. 378-380; and Ando et al., IEEE Electron Device Lett., vol. 24, pp. 289-291, May 2003. An overlapping gate structure, or field plate, was used by Zhang et al. with GaN HEMTs for high-voltage switching applications. Zhang et al., IEEE Electron Device Lett., vol. 21, pp. 421-423, September 2000. Following this, Karmalkar et al. performed simulations for the field plate structure, predicting up to five times enhancement in breakdown voltages. Karmalkar et al., IEEE Trans. Electron Devices, vol. 48, pp. 1515-1521, August 2001. However, fabricated devices at that time had low cutoff frequencies, not suitable for microwave operation. Ando et al. recently used a similar structure with smaller gate dimensions and demonstrated performance of 10.3 W output power at 2 GHz using a 1-mm-wide device on a SiC substrate. Ando et al., IEEE Electron Device Lett., vol. 24, pp. 289-291, May 2003. Chini et al. implemented a new variation of the field-plate design with further reduced gate dimensions and obtained 12 W/mm at 4 GHz from a 150-μm-wide device on a sapphire substrate. Chini et al., IEEE Electron Device Lett., vol. 25, No. 5, pp. 229-231, May 2004.

Recently, GaN-based HEMTs with electric field modification by field plates have boosted power density to greater than 30 W/mm at frequencies up to 8 GHz. See, e.g., Y.-F. Wu et al., "30-W/mm GaN HEMTs by Field Plate Optimization," IEEE Electron Device Lett., Vol. 25, No. 3, pp. 117-119, March 2004. However, since a field plate adds parasitic capacitances to a device and reduces gain, the design and fabrication of a GaN based HEMT capable of millimeter wave operation has been difficult.

Millimeter wave transistor operation (i.e. transistor operation at frequencies exceeding about 30 GHz) presents additional challenges due to the switching speeds required for such frequencies. Notwithstanding these challenges, millimeter wave devices have been demonstrated in gallium arsenide (GaAs) technology. In particular, GaAs pHEMTs have achieved 8.5 W output from devices having a gate periphery of 14.7-mm during near-millimeter wave operation. See, e.g., M. R. Lyons, et al., IEEE MTT-S/IMS Proceedings, pp. 1673-1676, Fort Worth, Tex., Jun. 6-11, 2004. However, for a given level of power output at a desired frequency of operation, GaAs devices tend to be much larger than corresponding GaN-based devices.

Applications for millimeter wave devices include digital radio transceivers for cellular communications backhaul, and ground terminal transceivers for very small aperture terminals (VSATs). Such devices may operate within radio bands up to 42 GHz, including frequencies in the Ku (12 GHz to 18

GHz) and Ka (26 GHz to 40 GHz) frequency bands. Additional applications exist in E-band (60 GHz to 90 GHz) of millimeter wave frequencies.

SUMMARY

Transistors having various combinations and/or sub-combinations of transistor characteristics described above may also be provided according to some embodiments of the present invention.

Embodiments of the invention provide a field effect transistor including a Group III-nitride channel layer and a spacer layer on the Group III-nitride channel layer. A gate contact is on the Group III-nitride channel layer and is configured to modulate a conductivity of the channel layer when a sufficient voltage is applied to the gate contact. The gate contact has a gate length that is sufficient to permit modulation of the conductivity of the channel layer at frequencies exceeding 30 GHz. A lower field plate is electrically connected to the gate contact and extends across the spacer layer a distance $L_{FD}$ toward the drain contact. $L_{FD}$ may be at least about 0.1 μm. Source and drain contacts are on the Group III-nitride channel layer. The field effect transistor is configured to exhibit a power density of greater than about 5 W/mm when operated at a frequency of at least 30 GHz. In some embodiments, $L_{FD}$ may be about 0.25 μm. The spacer layer may include SiN.

The field effect transistor may further include a Group III-nitride barrier layer on the channel layer. The gate contact and the spacer layer may be on the barrier layer, and the barrier layer and the channel layer may cooperatively induce a two-dimensional electron gas in the channel layer near an interface between the barrier layer and the channel layer.

The barrier layer may include a first barrier sublayer on the channel layer and a second barrier sublayer on the first barrier sublayer. The first barrier sublayer may include AlN and the second barrier sublayer may include $Al_xGa_{1-x}N$, wherein $0.15 \leq x \leq 0.45$.

The first barrier sublayer may have a thickness of about 0 to about 4 nm, and the second barrier sublayer may have a thickness of about 10 to about 50 nm.

The channel layer may include a first channel sublayer and a second channel sublayer on the first channel sublayer. The first channel sublayer may include GaN and may have a concentration of Fe dopants of at least about $1 \times 10^{17}/cm^3$. The second channel sublayer may include GaN and may have a concentration of Fe dopants therein that decreases with distance from the first channel sublayer.

The field plate may extend across the spacer layer toward the source contact by a distance $L_{FS}$ of about 0.2 μm.

The power density of at least 5 W/mm may be provided at a drain voltage of 28 V.

The field effect transistor may have a power added efficiency (PAE) greater than about 30%. The field effect transistor may be configured to exhibit a power density of greater than about 8 W/mm when operated at a frequency of at least 30 GHz. According to some embodiments of the invention, the field effect transistor may be configured to exhibit a power density of greater than about 5 W/mm when operated at a frequency of at least 40 GHz.

A field effect transistor according to some embodiments of the invention has a power density of greater than 5 W/mm when operated at a frequency of at least 30 GHz. The power density of at least 5 W/mm may be provided at a drain voltage of 28 V. The field effect transistor may have a PAE greater than about 30%.

A field effect transistor according to some embodiments of the invention has a power density of greater than 8 W/mm and PAE greater than 30% when operated at a frequency of at least 35 GHz. A field effect transistor according to further embodiments of the invention has a power density of greater than 8 W/mm and PAE greater than 30% when operated at a frequency of at least 40 GHz.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
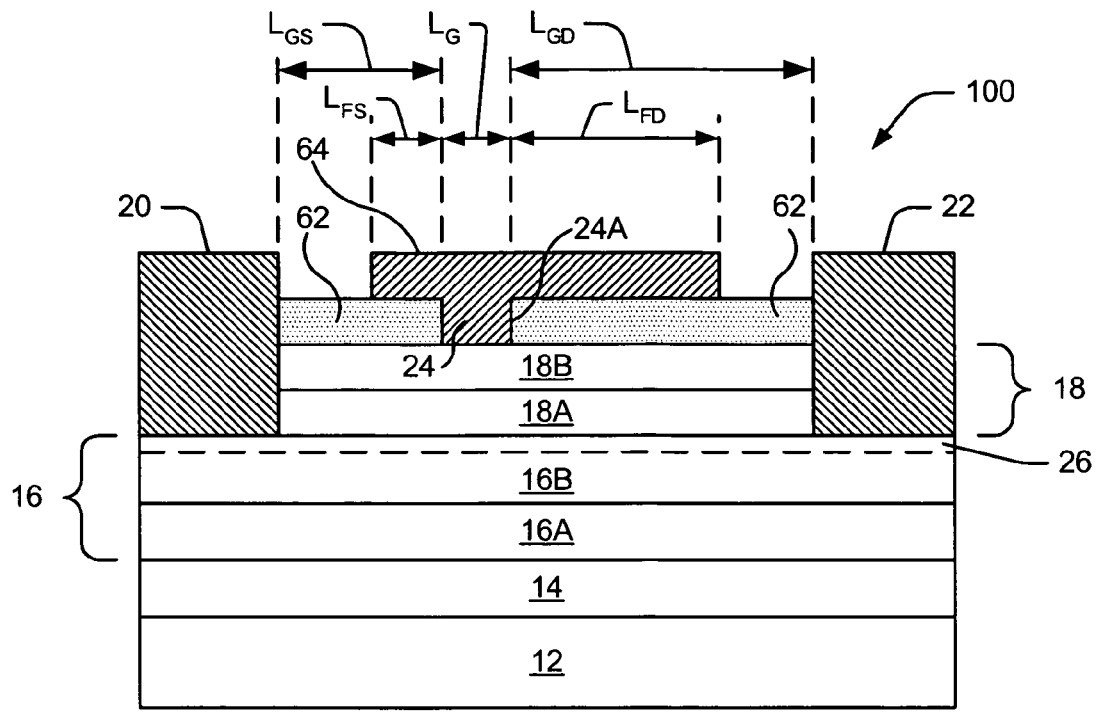
FIG. 1 is a cross-sectional diagram of a transistor according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented."above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Embodiments of the present invention may be particularly well suited for use in nitride-based devices such as Group III-nitride based HEMTs. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlIiN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

While embodiments of the present invention are described with reference to particular structures, other structures and/or techniques for fabricating GaN-based HEMTs could also be utilized in some embodiments of the present invention. Such structures and/or techniques may include those described, for example, in commonly assigned U.S. Pat. No. 6,316,793 and U.S. Patent Publication No. 2002/0066908A1 filed Jul. 12, 2001 and published Jun. 6, 2002, for "Aluminum Gallium Nitride/Gallium Nitride High Electron Mobility Transistors Having a Gate Contact on a Gallium Nitride Based Cap Segment and Methods of Fabricating Same," U.S. Patent Publication No. 2002/0167023A1 to Smorchkova et al., published Nov. 14, 2002, entitled "Group-III Nitride Based High Electron Mobility Transistor (HEMT) With Barrier/Spacer Layer", U.S. patent application Ser. No. 10/617,843 filed Jul. 11, 2003 for "Nitride-Based Transistors and Methods of Fabrication Thereof Using Non-Etched Contact RecessES," U.S. patent application Ser. No. 10/772,882 filed Feb. 5, 2004 for "Nitride Heterojunction Transistors Having Charge-Transfer Induced Energy Barriers And Methods Of Fabricating The Same," U.S. patent application Ser. No. 10/897,726, filed Jul. 23, 2004 entitled "Methods Of Fabricating Nitride-Based Transistors With A Cap Layer And A Recessed Gate," U.S. patent application Ser. No. 10/849,617, filed May 20, 2004 entitled "Methods Of Fabricating Nitride-Based Transistors Having Regrown Ohmic Contact Regions And Nitride-Based Transistors Having Regrown Ohmic Contact Regions," U.S. patent application Ser. No. 10/849,589, filed May 20, 2004 and entitled "Semiconductor Devices Having A Hybrid Channel Layer, Current Aperture Transistors And Methods Of Fabricating Same," U.S. Patent Publication No. 2003/0020092 filed Jul. 23, 2002 and published Jan. 30, 2003 for "Insulating Gate AlGaN/GaN HEMT", and U.S. patent application Ser. No. 10/996,249, filed Nov. 23, 2004 and entitled "Cap Layers and/or Passivation Layers for Nitride-Based Transistors, Transistor Structures and Methods of Fabricating Same," the disclosures of which are incorporated herein as if described in their entirety.

Some embodiments of the invention provide wide bandgap field transistors having dual field plate configurations in which a second field plate is connected to the source contact of the transistor. Such transistors may have improved power capability and reduced gate-to-drain feedback capacitance.

Figure 2:
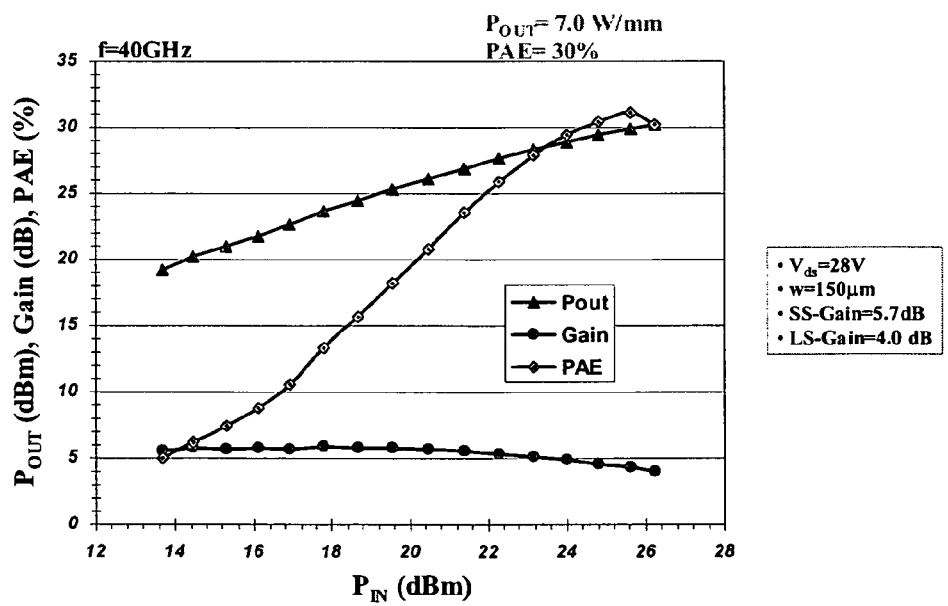
FIG. 2 is a power sweep graph at 40 GHz for a 150 μm-wide unit cell device according to some embodiments of the present invention.
Figure 3:
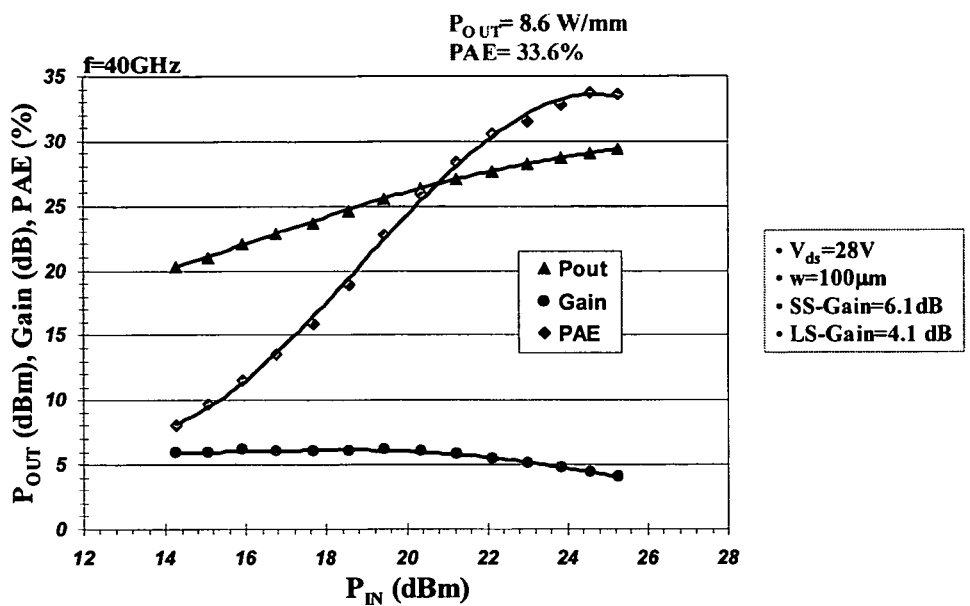
FIG. 3 is a power sweep graph at 40 GHz for a 100 μm-wide unit cell device according to some embodiments of the present invention.

Exemplary devices according to some embodiments of the present invention are schematically illustrated in FIGS. 1-3. However, embodiments of the present invention should not be construed as limited to the particular exemplary embodiments described herein but may include any suitable structure that provides transistor characteristics as described herein.

Turning to FIG. 1, a partial HEMT device structure 10 having a single field plate structure is illustrated. The structure 100 includes a substrate 12 on which nitride-based devices may be formed. In particular embodiments of the present invention, the substrate 12 may be a semi-insulating silicon carbide (SiC) substrate that may be, for example, a 4H polytype of silicon carbide. Other silicon carbide candidate polytypes include the 3C, 6H, and 15R polytypes. The term "semi-insulating" is used in a relative sense. In particular embodiments of the present invention, the silicon carbide bulk crystal has a resistivity equal to or higher than about $1 \times 10^5$ Ω-cm at room temperature.

An AlN buffer layer 14 may be provided to provide an appropriate crystal structure transition between the silicon carbide substrate and the remainder of the device. The buffer layer 14 may have a thickness of from about 100 nm to about 500 nm. In particular embodiments, the buffer layer 14 may have a thickness of about 200 nm.

Additional buffer layers, transition layers, and/or nucleation layers as described above may be provided between the substrate 12 and the channel layer 16. For example, strain balancing transition layer(s) may also be provided as described, for example, in commonly assigned U.S. Patent Publication No. 2003/0102482A1, filed Jul. 19, 2002 and published Jun. 5, 2003, and entitled "Strain Balanced Nitride Heterojunction Transistors And Methods Of Fabricating Strain Balanced Nitride Heterojunction Transistors," or United States Patent Publication No. 2004/0012015 A1, filed Jul. 19, 2002 and published Jan. 22, 2004, and entitled "Strain Compensated Semiconductor Structures And Methods Of Fabricating Strain Compensated Semiconductor Structures," the disclosures of which are incorporated herein by reference as if set forth fully herein.

Appropriate SiC substrates are manufactured by, for example, Cree, Inc., of Durham, N.C., the assignee of the present invention, and methods for producing are described, for example, in U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,592,501, the contents of which are also incorporated herein by reference in their entirety.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, a buffer layer appropriate to the type of substrate used may also be formed. For example, in embodiments where a sapphire substrate is used, the buffer may be formed as provided in U.S. Pat. No. 5,686,738.

Still referring to FIG. 1, a channel layer 16 is provided on the buffer layer 14. The channel layer 16 may be under compressive strain. Furthermore, the channel layer 16, the buffer layer 14 and/or nucleation and/or transition layers may be deposited by MOCVD or by other techniques known to those of skill in the art, such as MBE or HVPE.

In some embodiments of the present invention, the channel layer 16 includes a Group III-nitride, and, in particular includes GaN. The channel layer 16 may be undoped ("unintentionally doped") and/or doped with a dopant, and may be grown to a thickness of greater than about 20 Å. In-particular embodiments of the present invention, the channel layer 16 is GaN and has a thickness of about 1.6 μm.

As shown in FIG. 1, the channel layer 16 may include a first channel sublayer 16A formed on the buffer layer 14 and a second channel sublayer 16B formed on the first channel sublayer 16A. The first channel sublayer 16A may have a thickness of about 0.1-0.8 μm. The first channel sublayer 16A may be doped with Fe at a concentration of at least about $1\times10^{17}/cm^3$, and in particular may have a Fe concentration of about $1\times10^{18}/cm^3$.

A metalorganic source gas such as Ferrocene may be used as a source gas for providing the Fe dopants when forming the first channel sublayer 16A using chemical vapor deposition. When the Fe source gas is switched off after the growth of the first channel sublayer 16A is complete, some residual Fe may become incorporated into subsequently grown layers. That is, some of the Fe source material may remain in the growth system even after the Fe source gas is switched off, which may cause the concentration of Fe in the epitaxial layers to decrease relatively slowly after the source is switched off. Accordingly, a second channel sublayer 16B may be provided on the first channel sublayer 16A. The second channel sublayer 16A may have a thickness of about 0.2-2.0 μm, and may be unintentionally doped. However, as noted above, the second channel sublayer 16B may include a concentration of Fe dopants that decreases with distance from the first channel sublayer 16A.

In particular embodiments, the first channel sublayer 16A has a thickness of about 0.8 μm, and the second channel sublayer 16B has a thickness of about 0.8 μm.

A barrier layer 18 is provided on the channel layer 16. The barrier layer 18 may have a bandgap that is larger than the bandgap of the channel layer 16, and the barrier layer 18 may also have a smaller electron affinity than the channel layer 16.

The barrier layer 18 may be formed on the channel layer 16. In certain embodiments of the present invention, the barrier layer includes an first barrier sublayer 18A on the channel layer 16 and a second barrier sublayer 18B on the first barrier sublayer 18A. The first barrier sublayer 18A may include AlN and may have a thickness of about 0-4 nm. The second barrier sublayer 18B may include $Al_xGa_{1-x}N$ and may have a thickness of about 10-50 nm. The second barrier 18B may have a mole fraction of aluminum of about 15%-45% (i.e. $0.15 \leq x \leq 0.45$). In particular embodiments, the first barrier sublayer 18A may be about 0.8 nm thick. The second barrier sublayer 18B may have a thickness of about 25 nm and may have a mole fraction of aluminum of about 25% (i.e. x~0.25).

Examples of barrier layers according to certain embodiments of the present invention are described in U.S. Patent Publication No. 2002/0167023A1, to Smorchkova et al., entitled "Group-III Nitride Based High Electron Mobility Transistor (HEMT) With Barrier/Spacer Layer" the disclosure of which is incorporated herein by reference as if set forth fully herein.

In particular embodiments of the present invention, the barrier layer 18 is thick enough and has a high enough Al composition and doping to induce a significant carrier concentration at the interface between the channel layer 16 and the barrier layer 18 through polarization effects.

A gate contact 24 is provided on the barrier layer 18. Source and drain contacts 20 and 22 are provided as ohmic contacts on and/or extending through the barrier layer 18. Ohmic contacts are processed (e.g., by sintering) to have a low resistivity connection through the barrier layer 18 to the channel layer 16. For example, the source and drain contacts 20, 22 may be formed on the barrier layer 18 by electron beam evaporation and may be annealed, for example, at about 880° C. Thus, as shown in FIG. 1, after processing, the ohmic contacts 20 and 22 may extend through the barrier layer 18 to the channel layer 16. Electric current may flow between the source and drain contacts 20, 22 through a 2DEG channel 26 induced in the channel layer 16 near the interface between the channel layer 16 and the barrier layer 18 when the gate 24 is biased at an appropriate level with respect to the source 20.

The gate 24 may be formed, for example, using electron beam evaporation, and may include a Ni/Au structure having a layer of nickel about 10-500 nm thick and a layer of gold about 100-1000 nm thick. In particular embodiments, the gate 24 may include about 20 nm of nickel and about 500 nm of gold.

The gate 24 may have a gate length $L_G$ of about 0.15-0.25 μm (for operation in the millimeter wave range, i.e. at frequencies above about 30 GHz). In particular, for millimeter wave operation, the gate 24 may have a gate length $L_G$ of about 0.2 µm. Gate length ($L_G$) affects the transit time of carriers under the gate, which in turn affects the operating frequency of the device.

The gate-to-drain spacing $L_{GD}$ may be about 1.4 µm and the gate-to-source spacing $L_{GS}$ may be about 0.8 µm.

A non-conducting first spacer layer 62 is provided on the barrier layer 18 between the gate 24 and the source and drain contacts 20, 22. The first spacer layer 62 may include $Si_xN_y$ ($2 \leq x \leq 4$, $3 \leq y \leq 5$) having a thickness of about 50-300 nm. In particular embodiments, the first spacer layer 62 may include a layer of $Si_3N_4$ having a thickness of about 200 nm.

The first spacer layer 62 can be formed before device metallization, and in some embodiments can be grown using the same epitaxial growth techniques as were used to form the barrier layer 18. The first spacer layer 62 may include an epitaxial material such as a Group III-nitride material having different Group III elements such as alloys of Al, Ga, or In, with a suitable spacer layer material being $Al_xGa_{1-x}N$ ($0 \leq x \leq 1$). Alternatively, the spacer layer 62 may include $Si_xN_y$, $SiO_2$, Si, Ge, $MgO_x$, $MgN_x$, ZnO, alloys and/or layer sequences thereof. References to SiN, SiON, $SiO_x$, $MgN_x$ and the like refer to stoichiometric and/or non-stoichiometric materials.

The first spacer layer 62 may be formed on the entire upper surface of the barrier layer 18.

The first spacer layer 62 may then be selectively etched to provide an opening for the gate 24. Openings may also be etched for the source contact 20 and the drain contact 22. During metallization, the gate 24 may be formed to be in electrical contact with the barrier layer 18.

The first field plate 64 may be formed integral to the gate 24 and may extend on the spacer layer 62 a distance $L_{FD}$ in the range of 0.1 to 0.3 µm toward the drain contact 22 and/or a distance $L_{FS}$ in the range of 0 to 0.3 µm toward the source contact 20. In particular embodiments, the first field plate 64 may extend a distance $L_{FD}$ of about 0.25 µm toward the drain contact 22 and a distance $L_{FS}$ of about 0.2 µm toward the source contact 20.

The first field plate 64 may be electrically connected to the gate 24, for example, by its integral formation with the gate 24. The first field plate 64 can extend continuously from the gate 24 or can have breaks/holes in the connection with the gate 24 on either the source or drain side of the gate contact 24, or both, as long as enough conductive paths are available to effectively spread current between the gate 24 and the first field plate 64.

Since the first field plate 64 may be formed integral with the gate 24, the first field plate 64 may be formed, for example, using electron beam evaporation, and may include a Ni/Au structure having a layer of nickel about 10-500 nm thick and a layer of gold about 100-1000 nm thick. In particular embodiments, the first field plate 64 may include about 20 nm of nickel and about 500 nm of gold.

The source and drain ohmic contacts can be made of different materials including but not limited to alloys of titanium, aluminum, gold or nickel. The gate 24 and first field plate 64 can also be made of different materials including but not limited to gold, nickel, platinum, titanium, chromium, alloys of titanium and tungsten, or platinum silicide.

Transistors with field plates and methods of fabricating such transistors are described, for example, in U.S. patent application Ser. No. 11/078,265 filed Mar. 11, 2005 and entitled "Wide Bandgap Transistors With Gate-Source Field Plates", U.S. patent application Ser. No. 10/930,160, filed Aug. 31, 2004 and entitled "Wide Bandgap Transistor Devices With Field Plates", U.S. patent application Ser. No. 10/856,098, filed May 28, 2004 and entitled "Cascode Amplifier Structures Including Wide Bandgap Field Effect Transistor With Field Plate" and International Application Number PCT/US04/29324, filed Sep. 9, 2004 and entitled "Fabrication Of Single Or Multiple Gate Field Plates," the disclosures of which are incorporated herein by reference as if set forth in their entirety.

The dimension of the gate contact 24 extending in a direction transverse to the gate length (i.e. into and out of the page in FIG. 1) is referred to herein as the gate width $W_G$. Power density is a normalized device characteristic that permits comparisons across different size devices. Power density is defined as power output in watts per millimeter of gate width, or W/mm.

EXAMPLE DEVICE

A first exemplary device having a single field plate structure includes a high purity semi-insulating SiC substrate 12. An AlN buffer layer 14 is formed on the substrate 12 and has a thickness of about 200 nm. A GaN first channel sublayer 16A is provided on the buffer layer 12 and has a thickness of about 0.8 µm. The first channel sublayer 16A is doped with Fe at a concentration of about $1 \times 10^{18}/cm^3$. A GaN second channel sublayer 16B having a thickness of about 0.8 µm is formed on the first channel sublayer 16A. The second channel sublayer 16B is unintentionally doped, but has a residual concentration of Fe dopants therein that decreases with distance from the first channel sublayer 16A.

A first barrier sublayer 18A is provided on the second channel sublayer 16B. The first barrier layer is formed of AlN and has a thickness of about 0.8 nm. A second barrier layer 18B, including AlGaN with about 25% Al, is provided on the first barrier sublayer 18A and has a thickness of about 25 nm.

A first spacer layer 62 formed of $Si_3N_4$ is provided on the second barrier sublayer 18B and has a thickness of about 200 nm.

Source and drain contacts 20 and 22 extend through the first and second barrier layers 18A, 18B and are comprised of Ti/Al/Ni/Au having respective thicknesses of about 10 nm/120 nm/30 nm/50 nm for a total thickness of about 220 nm. The gate contact 24 is also provided on the second barrier sublayer 18B and is Ni/Au with a total thickness of about 520 nm (20 nm Ni/500 nm Au). The first field plate 64 is provided on the first spacer layer 62 and has the same composition as the gate 24. Furthermore, $L_G$ is about 0.15-0.18 µm, $L_{FS}$ is about 0.2 µm, and $L_{FD}$ is about 0.25 µm. The gate-to-drain spacing $L_G D$ is about 1.4 µm and the gate-to-source spacing $L_{GS}$ is about 0.8 µm.

Over-size air bridges are used for low source grounding resistance and inductance.

Figure 4:
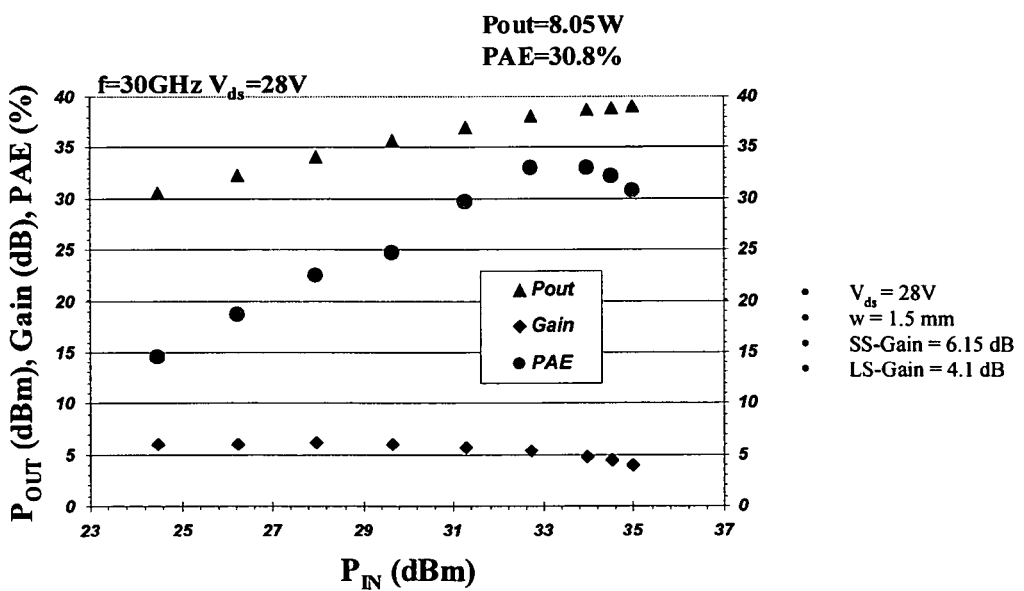
FIG. 4 is a power sweep graph at 30 GHz for a 1.5 mm-wide transistor according to some embodiments of the present invention.

Performance of exemplary devices as described herein will now be described. Unless indicated otherwise, the devices discussed below with reference to FIGS. 2-4 are devices having the exemplary structure described above. However, embodiments of the present invention should not be construed as limited to these particular devices but includes other devices capable of providing the performance characteristics described herein. Furthermore, while various theories of operation are described herein, embodiments of the present invention should not be construed as limited to a particular theory of operation.

Power performance was characterized with a Focus load-pull system at 30-40 GHz. The continuous wave (CW) power sweep at 40 GHz for a device having the exemplary unit cell device structure with a gate width $W_G$=150 µm was measured and the results are shown in FIG. 2. The device was measured on-wafer at room temperature and at a drain-source bias $V_{DS}$=28V. As seen in FIG. 2, the device achieved approximately 7 W/mm at an input level of 26 dBm. The associated power added efficiency (PAE) at 40 GHz was about 30%, with a small signal gain of 5.7 dB (large signal gain 4.0 dB). The device exhibited a maximum transconductance $g_{m,max}$ of 370 mS/mm and maximum drain current up to 1.4 A/mm at a gate bias of +3V. The current-gain cutoff frequency $f_t$ was 54 GHz, and the power-gain cutoff frequency $f_{max}$ was 110 GHz.

A 100 μm gate width unit cell device was measured at 40 GHz and drain-source bias of 28 V. The continuous wave (CW) power sweep at 40 GHz for the device is shown in FIG. 3. As seen therein, the device exhibited 8.6 W/mm and PAE of 33.6% at an input level of 25 dBm, with a small signal gain of 6.1 dB and large signal gain of 4.1 dB.

The continuous wave (CW) power sweep at 30 GHz for a transistor device having the exemplary device structure with a gate width $W_G$=1.5 mm is shown in FIG. 4. At a drain-source bias of 28 V, the device produced an output power $P_{out}$ of 8.05 W at a PAE of 30.8%.

A scaled device having a gate width $W_G$ of 1.05 mm produced 5.15 W of output power and 31% PAE at 35 GHz.

Accordingly, some embodiments of the invention may provide improved power performance for wide bandgap field effect transistors at millimeter wave frequencies. Some embodiments of the invention may provide high efficiency, high power and/or high gain operation, and/or more stable operation due to higher input-output isolation (i.e. decreased gate to drain capacitance $C_{GD}$).

In the drawings and specification, there have been disclosed typical embodiments of the invention, and, although specific terms have been employed, they have been used in a generic and descriptive sense only and not for purposes of limitation.

That which is claimed is:

1. A field effect transistor, comprising:
a Group III-nitride channel layer;
a spacer layer on the Group III-nitride channel layer;
a gate contact on the Group III-nitride channel layer and configured to modulate a conductivity of the channel layer in response to a voltage applied to the gate contact, the gate contact having a gate length that is sufficient to permit modulation of the conductivity of the channel layer at frequencies exceeding 30 GHz;
source and drain contacts on the Group III-nitride channel layer; and
a lower field plate electrically connected to the gate contact and extending across the spacer layer a distance $L_{FD}$ toward the drain contact, wherein $L_{FD}$ is at least about 0.1 μm.

2. The field effect transistor of claim 1, further comprising a Group III-nitride barrier layer on the channel layer, wherein the gate contact and the spacer layer are on the barrier layer, and the barrier layer and the channel layer cooperatively induce a two-dimensional electron gas in the channel layer near an interface between the barrier layer and the channel layer.

3. The field effect transistor of claim 2, wherein the barrier layer comprises a first barrier sublayer on the channel layer and a second barrier sublayer on the first barrier sublayer, the first barrier sublayer comprising AlN and the second barrier sublayer comprising $Al_xGa_{1-x}N$, wherein $0.15 \leq x \leq 0.45$.

4. The field effect transistor of claim 3, wherein the first barrier sublayer has a thickness of about 0 to about 4 nm and the second barrier sublayer has a thickness of about 10 to about 50 nm.

5. The field effect transistor of claim 1, wherein the channel layer comprises a first channel sublayer and a second channel sublayer on the first channel sublayer, the first channel sublayer comprising GaN and having a concentration of Fe dopants of at least about $1 \times 10^{17}/cm^3$, the second channel sublayer comprising GaN and having a concentration of Fe dopants therein that decreases with distance from the first channel sublayer.

6. The field effect transistor of claim 1, wherein $L_{FD}$ is about 0.25 μm.

7. The field effect transistor of claim 6, wherein the spacer layer comprises SiN.

8. The field effect transistor of claim 1, wherein the field plate extends across the spacer layer toward the source contact by a distance $L_{FS}$ of about 0.2 μm.

9. The field effect transistor of claim 1, wherein the power density of at least 5 W/mm is provided at a drain voltage of 28 V.

10. The field effect transistor of claim 1, wherein the field effect transistor has a power added efficiency greater than about 30%.

11. The field effect transistor of claim 1, wherein the field effect transistor is configured to exhibit a power density of greater than about 8 W/mm when operated at a frequency of at least 30 GHz.

12. The field effect transistor of claim 1, wherein the field effect transistor is configured to exhibit a power density of greater than about 5 W/mm when operated at a frequency of at least 40 GHz.

* * * * *